United States Patent [19]

Ragsdale

[11] Patent Number: 5,280,404
[45] Date of Patent: Jan. 18, 1994

[54] ARC DETECTION SYSTEM

[75] Inventor: Charles W. Ragsdale, Concord, Calif.

[73] Assignee: Bio-Rad Laboratories, Inc., Hercules, Calif.

[21] Appl. No.: 883,505

[22] Filed: May 15, 1992

[51] Int. Cl.⁵ .............................................. H02H 1/04
[52] U.S. Cl. ......................................... 361/113; 361/2
[58] Field of Search ....................... 361/113, 93, 2, 94; 307/137

[56] References Cited

U.S. PATENT DOCUMENTS

| | | | |
|---|---|---|---|
| 3,746,930 | 7/1973 | Van Best et al. | 317/31 |
| 3,855,443 | 12/1974 | Bell, Jr. et al. | 219/69 |
| 4,047,235 | 9/1977 | Davis | 361/100 |
| 4,115,828 | 9/1978 | Rowe et al. | 361/1 |
| 4,376,243 | 3/1983 | Renn et al. | 219/514 |
| 4,402,030 | 8/1983 | Moser et al. | 361/93 |
| 4,670,812 | 6/1987 | Deerfler et al. | 361/94 |

Primary Examiner—Todd DeBoer
Attorney, Agent, or Firm—Townsend and Townsend Khourie and Crew

[57] ABSTRACT

An arc detector for detecting electrical arcs across a break in a line carrying a current in an electrical system. Normally, the line carries current, but when the line is broken, current doesn't flow until an arc occurs across the break. The arc detector detects the break using a current sensor for measuring the current, a filter for filtering out unwanted frequencies, an amplifier for amplifying the remaining frequencies into a substantially square wave, a counter for counting square wave transitions, and a latch to hold a detection signal at an output node when the counter counts a preset number of square wave transitions without being reset by a reset switch or a periodic oscillator.

13 Claims, 4 Drawing Sheets

ARC DETECTION SYSTEM

BACKGROUND OF THE INVENTION

The present invention relates to the field of arc detection systems. More specifically, in one embodiment the invention provides a means for detecting arc in an electrical system and for disconnecting the power source supplying the power which sustains the arc when the arc is detected.

A common problem in electrical systems, especially those operating at high voltages, is the interruption of an electrical conduction path and subsequent formation of arcs. This occurs when a wire frays or a circuit element or trace breaks. Since a typical break leaves only a small gap, any current on the path might continue to flow through the path by arcing across the gap. The temperature of the arc is very high, and consequently, arcing in electrical systems could lead to fires, especially where the arc occurs within a piece of electronic equipment, where components and circuits tend to be tightly spaced. Another place where electrical fires are a problem is in electrical wiring in homes and businesses, since the wiring is often in contact with flammable materials such as insulation, carpeting, and wood.

When a break in a conduction path occurs, no current flows. Once an arc is established, current flows steadily. But while the arc is being established, the current pulses as a series of quick arcs leap across the gap and ionize the air over the gap. Thus arcing can be detected by monitoring the current flow for the series of pulses. While arc detectors are known in the prior art, such arc detectors have limited application and are not easily adaptable to the requirements for a broadly applicable arc detector.

One example of a prior art arc detector is disclosed and claimed in U.S. Pat. No. 4,376,243 issued to Renn, et al. In the arc detector shown in Renn, which is for use with an electric rod furnace, a shunt resistor is placed in the current path and the voltage across the shunt resistor is applied to an opto-isolator. The output of the opto-isolator is then used as the input to an arc detection circuit. The arc detection circuit includes a current change detector and a preset counter to count the number of instances where the current change is above a threshold. However, because of its application, the Renn arc detector does not need to address power usage, noise, or cost concerns.

With a shunt resistor, power is continually lost in the electrical system due to the voltage drop across the shunt. The shunt described in Renn consumes up to 500 watts, an amount which is insignificant compared to the 650 kilowatts consumed by the furnace. However, in normal, everyday applications power loss is more critical and shunt is impractical. Another problem with the shunt resistor is that it is not isolated from the electrical system, which is likely a high voltage system. Consequently, the isolation is limited to the isolation provided by the opto-isolator. Opto-isolators typically have low linearity, although this is less of a problem when dealing only with the DC currents in Renn. Also, with DC currents, AC filtering need not be addressed, since any AC currents are likely to be arc pulses.

Noise and the cost of the arc detector are also not a problem in the arc detector of Renn. Given the cost and size of the typical electric rod furnace, they are likely to be permanently installed in a controlled environment, such as a factory or a foundry. In this controlled environment, it is a small matter to eliminate sources of electrical noise, since most of the personnel near the electric rod furnace are likely to be working on the electric rod furnace and not operating AC equipment near the arc detector. The arc detector of Renn assumes a DC current, and a typical AC current sources would continually trigger such an arc detector. Thus, the only noise likely to interfere with the arc detector is the arc noise signal being detected. However, if the Renn arc detector were used in a home application, where a hand-held drill, vacuum cleaner or a washing machine motor might be expected to generate electrical noise very similar to an arc signal, an arc detector coupled to a conduction path must be immune to such noise sources, while still remaining feasible at a low cost.

Cost, and therefore circuit complexity, is also not a concern in the Renn detector, since even the most complex arc detection circuit will not be as complex as the circuits for controlling the furnace itself, and the cost of any such arc detector circuit would be insignificant given the cost of the furnace.

From the above it is seen that an improved arc detection system is needed. An improved arc detection system must be low cost, and therefore must comprise few components, must be capable of operating in noisy environments, and must not drain significant power from the circuit being monitored.

SUMMARY OF THE INVENTION

An improved arc detector is provided by virtue of the present invention. The detector includes a current sensor, preferably a current transformer which measures the current in a line of the electrical system with very low insertion loss, a filtering amplifier to amplify the current signal within the frequency range of arc pulses and to clip the amplified signal to form a square wave from the arc pulses, and a counter or other accumulator to count the clipped pulses. The counter has a latching means to hold the output of the counter once a predetermined number of pulses has been counted, and a reset means to clear the counter manually or upon initialization.

In response to the detection of a series of arc pulses, a shutoff means is provided for interrupting the power in the electrical system when the counter is triggered. In other embodiments, the power is cut by blocking the flow of current in the line being measured, or an arc detection signal is output to further circuits which remove the power from the electrical system by other means, such as signalling a power supply to reduce the supplied current or voltage to zero. The reset means includes a manual switch for resetting the arc detector, a power-on reset to initialize the arc detector, and an oscillating timer reset which periodically resets the counter to avoid the long term accumulation of stray pulses.

In one embodiment of an arc detector according to the present invention, the arc detector is integral to a power supply and when an arcing condition is detected, the output of the power supply is disabled. In another embodiment, the arc detector monitors a power line between a power input and a load, and interrupts the connection between the power input and the load when an arcing condition is detected. This embodiment might be used when the power supply is far from the point of likely arcing.

In a third embodiment, the arc detector is a stand-alone device coupled to an AC input to a power supply and magnetically coupled to a DC output of the power supply. The arc detector monitors the DC output of the power supply, and when an arc is detected, interrupts the flow of AC power to the power supply.

A further understanding of the nature and advantages of the inventions herein may be realized by reference to the remaining portions of the specification and the attached drawings.

DESCRIPTION OF THE PREFERRED EMBODIMENTS

Figure 1:
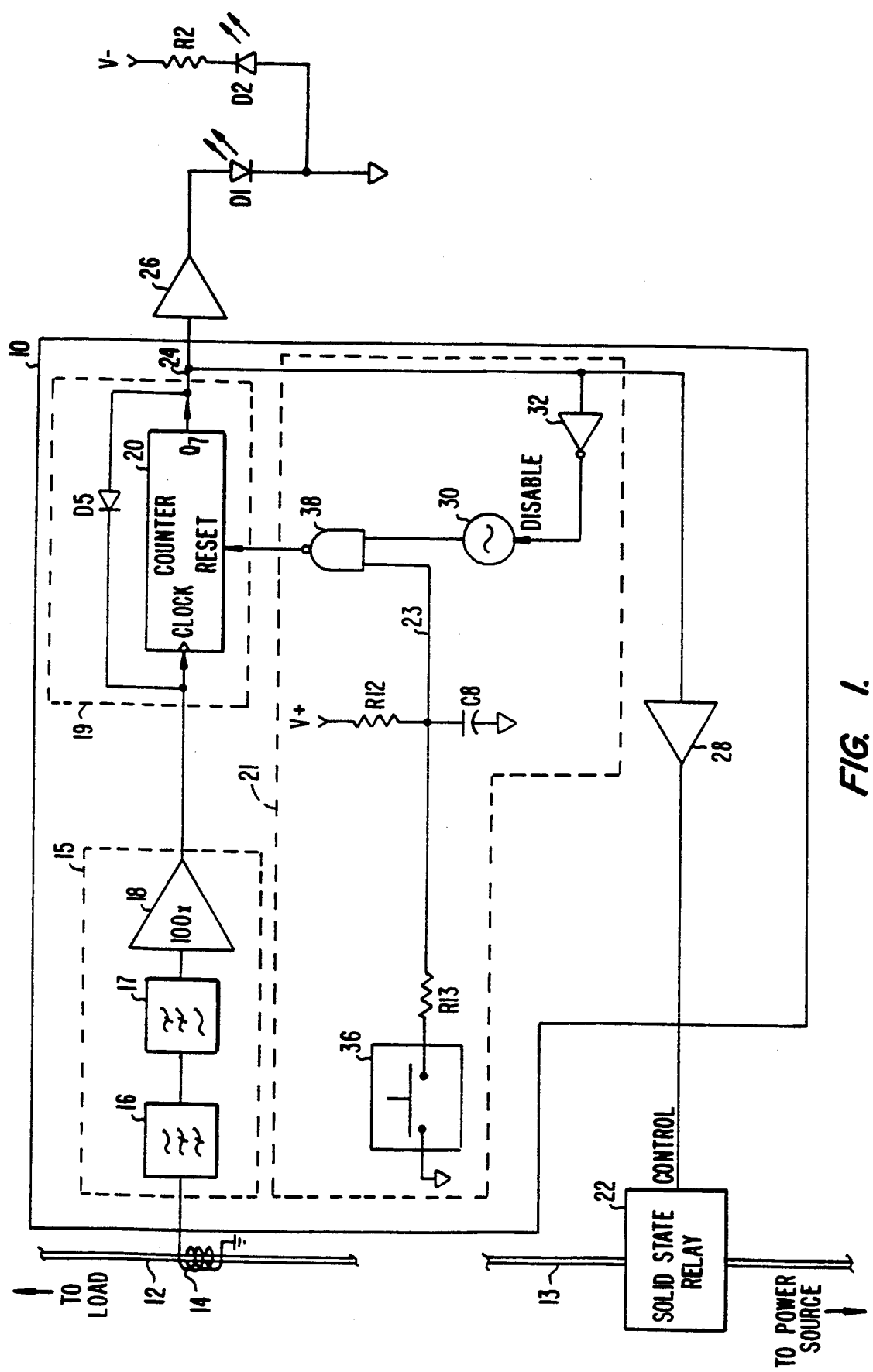
FIG. 1 is a partial schematic diagram of an arc detector according to the present invention.

FIG. 1 is a schematic diagram of an arc detector according to the present invention. An arc detector 10 detects arcs in an electrical system (not shown) by monitoring the current in the electrical system as, for example, would be flowing in a line 12. Line 12 supplies power to the electrical system, while line 13 draws power from a power source (also not shown). Because of the number of different embodiments of the present invention, circuit elements between lines 12 and 13 are omitted from FIG. 1, however several diagrams representing embodiments of the present invention are shown in FIG. 2. In one embodiment, line 12 and 13 are connected together directly, as in FIG. 2A and 2C. However, in other embodiments, line 12 contains power in a form different from that on line 13, as shown in FIG. 2D. Thus, the use of arc detector 10 is not limited to any particular application, except that the current flowing in line 12 must be representative of the current flowing in the load or electrical system being monitored, and the current on line 13 directly or indirectly supplies the power which causes current to flow in line 12.

Typically, line 12 is a DC output of a power supply which powers a load. However, in other embodiments, line 12 is a power line supplying power to the electrical system. The electrical system may include a power supply, and in such a system arc detector 10 is used to send a disable signal to the power supply. In other electrical systems, the current to the electrical system is interrupted by interrupting a power line to the electrical system without disabling the source of the power, and in those systems, the disable power line may be line 12.

A current transformer 14 is coupled to line 12, and current transformer 14 forms the input to arc detector 10. The arc detection circuit itself includes a filtering amplifier 15 and an accumulator 19. Filtering amplifier 15 includes a high pass filter 16, a low pass filter 17, and an amplifier 18. Accumulator 19 includes a counter 20, a diode D5, and a reset circuit 21. Reset circuit 21 includes an oscillator 30, an inverter 32, a switch 36, resistors R13 and R12, a capacitor C8, and a NAND gate 38. In other embodiments, accumulator 19 is an integrator, or a charge pump and a capacitor, and the reset circuit resets the integrator or discharges the capacitor.

Accumulator 19 provides an output signal at a node 24. Other devices in various embodiments are coupled by appropriate drivers to node 24, which is an output of counter 20 and is also the output of arc detection circuit 10. A current signal generated by current transformer 14 is passed in series through high pass filter 16, low pass filter 17, and amplifier 18, to a clock input of counter 20. Notably, since the output of arc detector 10 at node 24 is an electrical signal indicating the detection of an arc, any number of uses of the signal are possible, although only two, activating a light emitting diode (LED) D1 and turning off a solid state relay 22, are shown in FIG. 1. In the embodiment shown in FIG. 1, the detection signal at node 24 is a logical ONE when an arc is detected and a logical ZERO otherwise.

The operation of reset circuit 21 will now be described. When V+ and V− are first applied to the arc detection circuit, C8 is uncharged and holds a node 23 at ground (logical ZERO) until C8 charges through R12 after a time determined by the time constant of R12 and C8. When node 23 is at ground, the output of NAND gate 38 is a logical ONE, thereby keeping counter 20 in a reset state. Once C8 is charged, node 23 remains at logical ONE, and the output of NAND gate 38 is only determined by the inputs from oscillator 30. If switch 36, a manual reset switch, is pressed, node 23 is drawn to ground and the output of NAND gate 38 goes high, thereby resetting counter 20.

Oscillator 30 outputs an oscillating train of logical ONEs and ZEROes at a periodic oscillation rate. When the detection signal at node 24 is a logical ONE, the output of inverter 32 is a logical ZERO, and inverter 32 disables oscillator 30, causing the output of oscillator 30 to be a constant logical ONE. In normal operation, oscillator 30 periodically resets counter 20 to prevent the accumulation of stray pulses. However, once an arc condition has been detected, oscillator 30 is prevented from resetting counter 20 by inverter 32, otherwise the arcing condition would go undetected.

The detection signal at node 24 is provided as an input to an LED driver 26 for driving D1 and a relay driver 28. The output of relay driver 28 is used as a control input to solid state relay 22. Solid state relay 22 is in series with line 13, so that when solid state relay 22 is turned off by a signal from relay driver 28, solid state relay 22 acts as an open circuit, thereby preventing the flow of current in line 13, and when solid state relay 22 turns on due to the lack of a signal from relay driver 28, solid state relay 22 acts as a closed circuit, thereby allowing current to flow in line 13. In one embodiment, line 13 is also line 12, and therefore, the interruption of current in line 13 causes the interruption of current flowing through line 12 to the load. In other embodiments, the interruption of current in line 13 only indirectly stops the flow of current in line 12 to the load, as is the case where line 13 is the AC input to a power supply supplying high-voltage DC current through line 12. Having the current sensor on one line, line 12, and the solid state relay on another line, line 13, eliminates the need for a high-voltage relay in series with line 12. A high-voltage relay for a typical 1000 V DC voltage on line 12 would be considerably more expensive and dangerous to work with than a lower voltage solid state relay on line 13, which is typically 110 V or 220 V AC. Advantageously, the arc detector can be used to sense the high voltage output of a power supply while needing to control only the low voltage power into the power supply.

Diode D1 is used to indicate the state of arc detector 10. D1 is lit when the detection signal is asserted on node 24 indicating that an arc has been detected. D2 is lit whenever power (V−) is supplied to arc detector 10. D2, when lit, indicates that power is supplied to the arc detector, and D1, when lit, indicates that an arcing condition has been detected. Thus, when D2 is lit, but D1 is not, it is an indication that line 12 is being monitored but no arcing conditions are detected on that line, and when D2 is not lit, it is an indication that line 12 is not being monitored.

A diode D5 is coupled from node 24 back to the clock input of counter 20 to latch the output at node 24 by preventing any further clock pulses.

The operation of arc detector 10 will now be described. The current flowing in line 12 is representative of the current which would be flowing through an arc in the electrical system. Thus current transformer 14 measures the current across the arcing trace. If the current in line 12 is 60 Hz AC, current transformer 14 will pick up a substantially 60 Hz signal. Because a current transformer is a linear device and has no electrical connection to line 12, transformer 14 provides a relatively undistorted signal with high isolation to line 12. The isolation of line 12 can be made arbitrarily high, by varying the thickness of any insulation between line 12 and current transformer 14 and making the coils of transformer 14 as wide as necessary. The drop off in magnetic coupling of wider coils can be compensated for by adding more coils.

The transformer signal is then filtered by high pass filter 16 to attenuate the current signal above 10 kilohertz, and by low pass filter 17 to attenuate the signal below 1 kilohertz and especially 60 Hertz. When electric arcs begin, the current in line 12 pulses at a frequency of between 1 and 10 kilohertz while an arc is established; thus frequencies above 10 kilohertz are not of interest in detecting arcs.

Amplifier 18 amplifies and clips the current signal. The amplification of amplifier 18 is such that the arc pulses within the pass band of 1-10 kilohertz are converted to rail-to-rail square pulses. These square pulses are then applied to the clock input of counter 20.

Counter 20 counts the number of square pulses from amplifier 18. For simplicity, counter 20 is a binary counter and the number of pulses needed to trigger the arc detector is 128, thus only the $Q_7$ output of counter 20 is used. The $Q_7$ output is coupled to node 24, so that when 128 pulses are received without an intervening reset pulse, node 24 goes from a logical ZERO to a logical ONE. To further simplify the circuit, a logical ONE is made to correspond to a higher voltage than a logical ZERO as in, for example, TTL circuits. Because a logical ONE is a higher voltage than a logical ZERO, when node 24 goes high, diode D5 prevents the voltage at the clock input of counter 20 from falling to a logical ZERO, thereby disabling the input of counter 20 using only one diode.

A reset pulse from oscillator 30 is short, about 1 millisecond or less, so that a counter reset does not cause the arc detector to miss an arcing event. Since arcing pulses occur in the 1-10 kilohertz range, the arc detector will probably detect the 128 pulses needed to trigger in 100 milliseconds or less. The reset pulses from oscillator 30 are periodic with a period of 30-80 seconds, so counter 20 has ample time to count pulses from an arcing event.

Figure 2A:
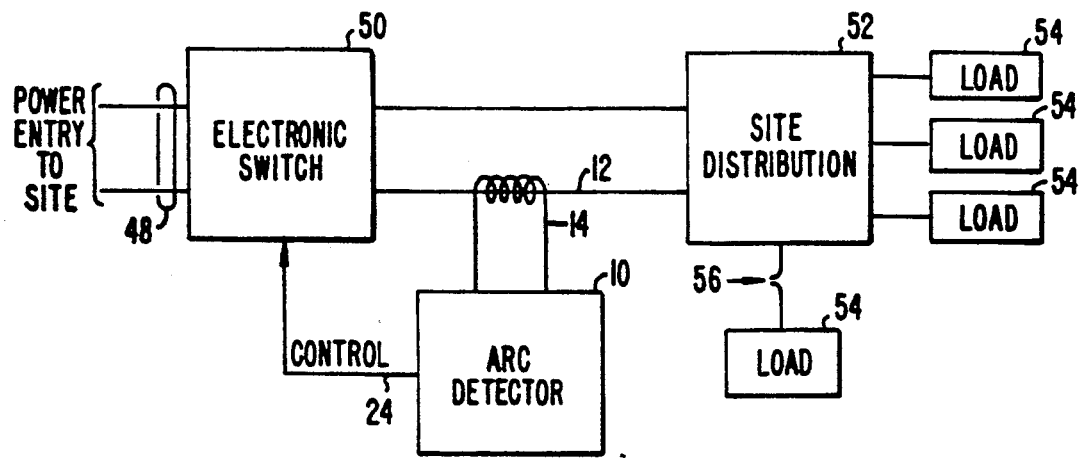
FIG. 2A is a block diagram showing the arc detector monitoring a power line.

FIG. 2A shows one application of arc detector 10, in a site power grid. A site is typically a home or business, where power comes in over a common trunk line 48, through electronic switch 50, where the power is distributed by site distribution means 52 to various loads 54. Even if a break 56 were to occur in a load, the current in line 12 might not be zero, as in the previously discussed case. This is so because line 12 carries the current for all loads, some which may be carrying current and others which have breaks in their current carrying lines. To prevent DC current or 60 Hz AC current on unbroken lines to loads 54 from saturating amplifier 18 or triggering counter 20, high pass filter 16 passes the pre-arc pulses but greatly attenuates DC and 60 Hz AC.

Figure 2B:
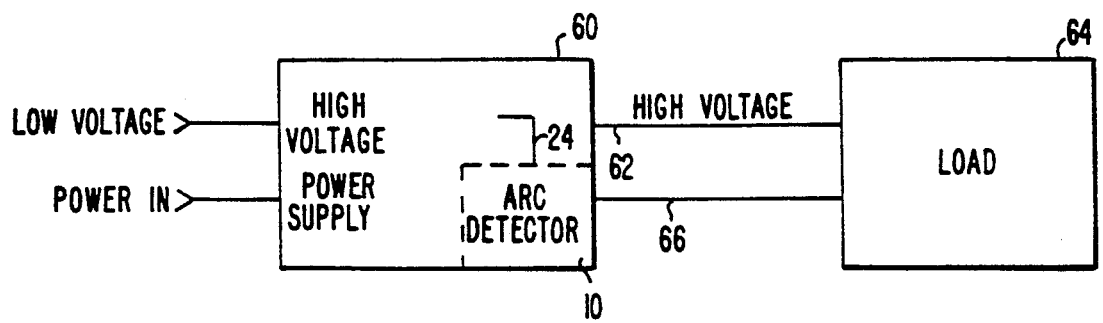
FIG. 2B is a block diagram showing the arc detector monitoring the output of a power supply.

FIG. 2B shows an embodiment of an arc detector according to the present invention, wherein arc detector 10 is included in a power supply 60. While the output of power supply 60 is shown as being high voltage, the present invention works equally well at low voltages, however there is less of a need for an arc detector at low voltages, since low voltages will generally not be able to power an arc.

Arc detector 10 monitors the current flow in an output line 62, and therefore is able to detect the formation of an arc anywhere in load 64. Of course, output line 62 can be generalized to include 2 or more wires, as in the case where more than one voltage is supplied to load 64, and a return line 66 can also be monitored if necessary. Thus by monitoring enough wires, the total current flow into load 64 can be found and pre-arc pulses in the current flow can be detected.

The output of arc detector 10, at node 24, can be used in a variety of ways by power supply 60. For example, node 24 could be coupled to a relay placed in series with line 62 and return line 66 to decouple load 64 when the formation of an arc is detected. The relay would be used where power supply 60 is needed to supply power to more than one load. If power supply 60 were supplying power to only load 64, node 24 could be coupled to a disabling circuit within power supply 60 which would shut down power supply 60 when a logical ONE is asserted on node 24, the logical ONE being asserted by counter 20 within arc detector 10 when arc formation in load 64 is detected. However, more typically, line 24 is used to disable the control circuitry of power supply 60, thus causing its output to drop to zero voltage.

Figure 2C:
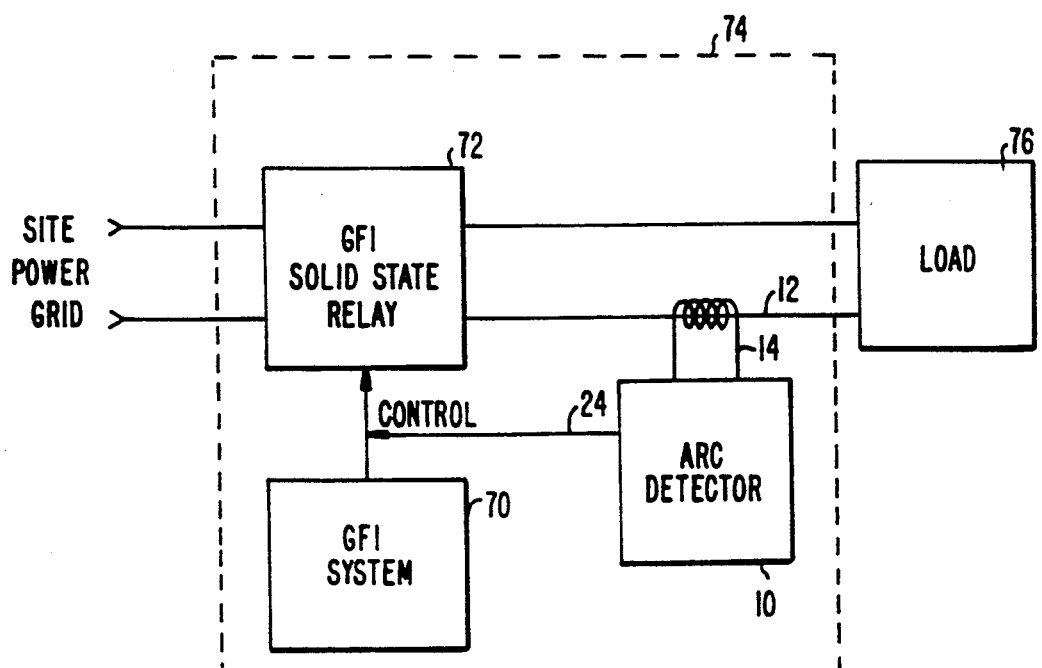
FIG. 2C is a block diagram showing the arc detector monitoring a power line in combination with a ground-fault interruption detector.
Figure 2D:
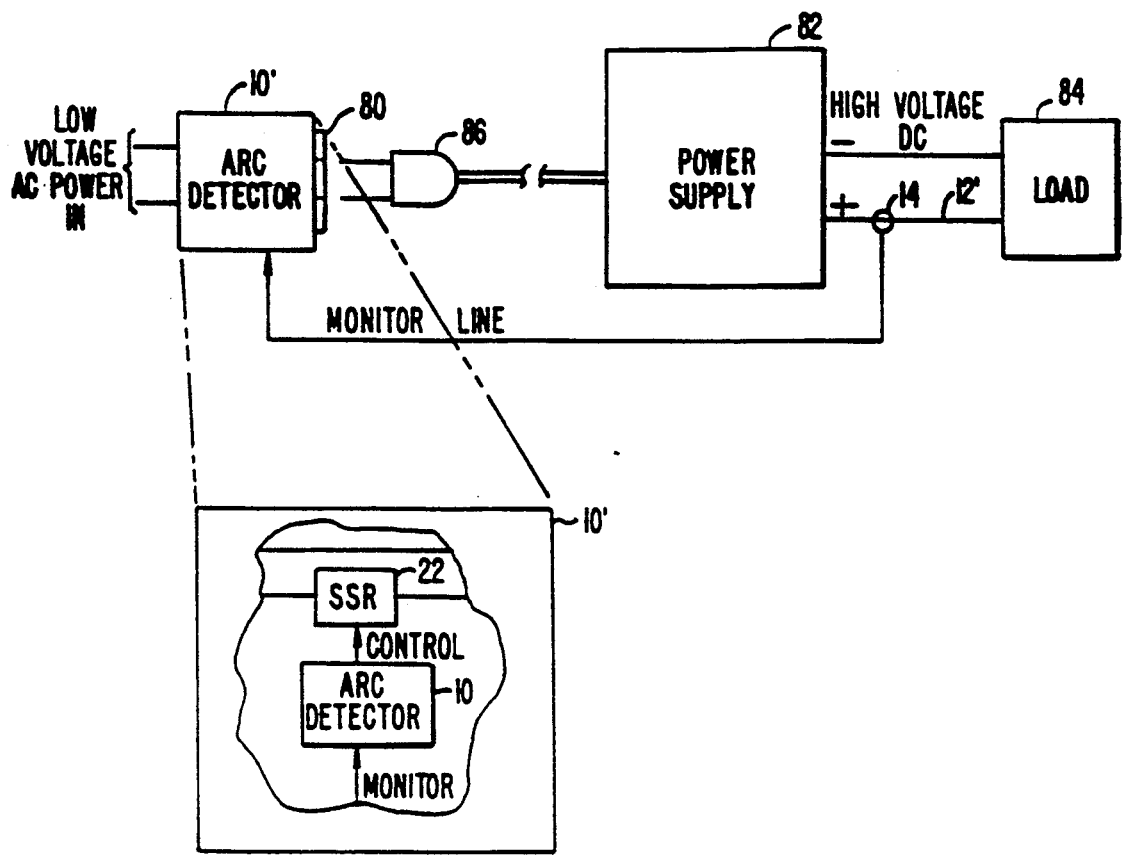
FIG. 2D is a block diagram showing the arc detector as a stand-alone device coupled to the power input and output of a high voltage DC power supply.

FIG. 2C illustrates another application of arc detector 10. Arc detector 10 and a ground-fault interrupter (GFI) system 70 are both coupled to a solid state relay 72, and along with solid state relay 72, are housed in housing 74. Such an embodiment as shown in FIG. 2C has particular cost advantages, since an arc detector can be added to an existing GFI protected outlet and use the existing case and solid state relay of the GFI system, thereby eliminating the additional cost of two of the most expensive components of an arc detector. In a typical application of an arc detector/GFI outlet, case 74 forms an electrical wall outlet in a home or business, and load is an appliance plugged into the outlet.

FIG. 2D is a block diagram illustrating an embodiment of the present invention wherein the arc detector monitors a high voltage line and disables a low voltage line. An arc detector 10' is powered by standard AC power and supplies the AC power to a socket 80. This AC power is used by a power supply 82 to generate high voltage DC power for a load 84. The AC power is supplied to power supply 82 through plug 86.

In normal operation, arc detector 10' passes the AC power through to socket 80, and power supply 82 generates high voltage currents at its output. If an arc begins in load 84, the distinctive frequency signature of the arcing condition will appear on line 12' and will be communicated to arc detector 10' via current sensor 14, which is coupled to an input of arc detector 10, The internal circuitry of arc detector 10' is similar to that of arc detector 10 shown in FIG. 1, except that arc detector 10' includes a solid state relay in series with the AC power lines. But one advantage of the system shown in FIG. 2D is that no electrical coupling to the high voltage lines is needed, since sensor 14 operates by magnetic coupling and arc detector 10, is only in series with the low voltage input power. Another advantage is that the embodiment show in FIG. 2D is usable with existing power supplies without requiring modification of the power supply.

Figure 3B:
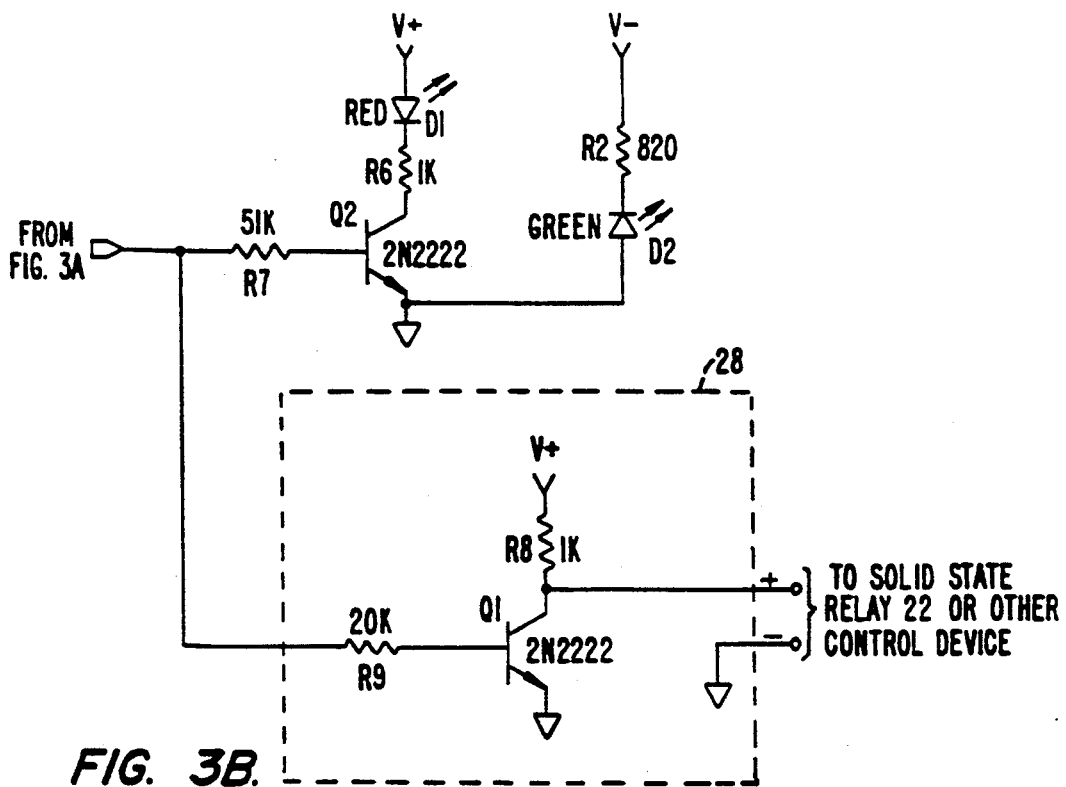
FIG. 3A and 3B are schematic diagrams of one embodiment of an arc detector according to the present invention.
Figure 3A:
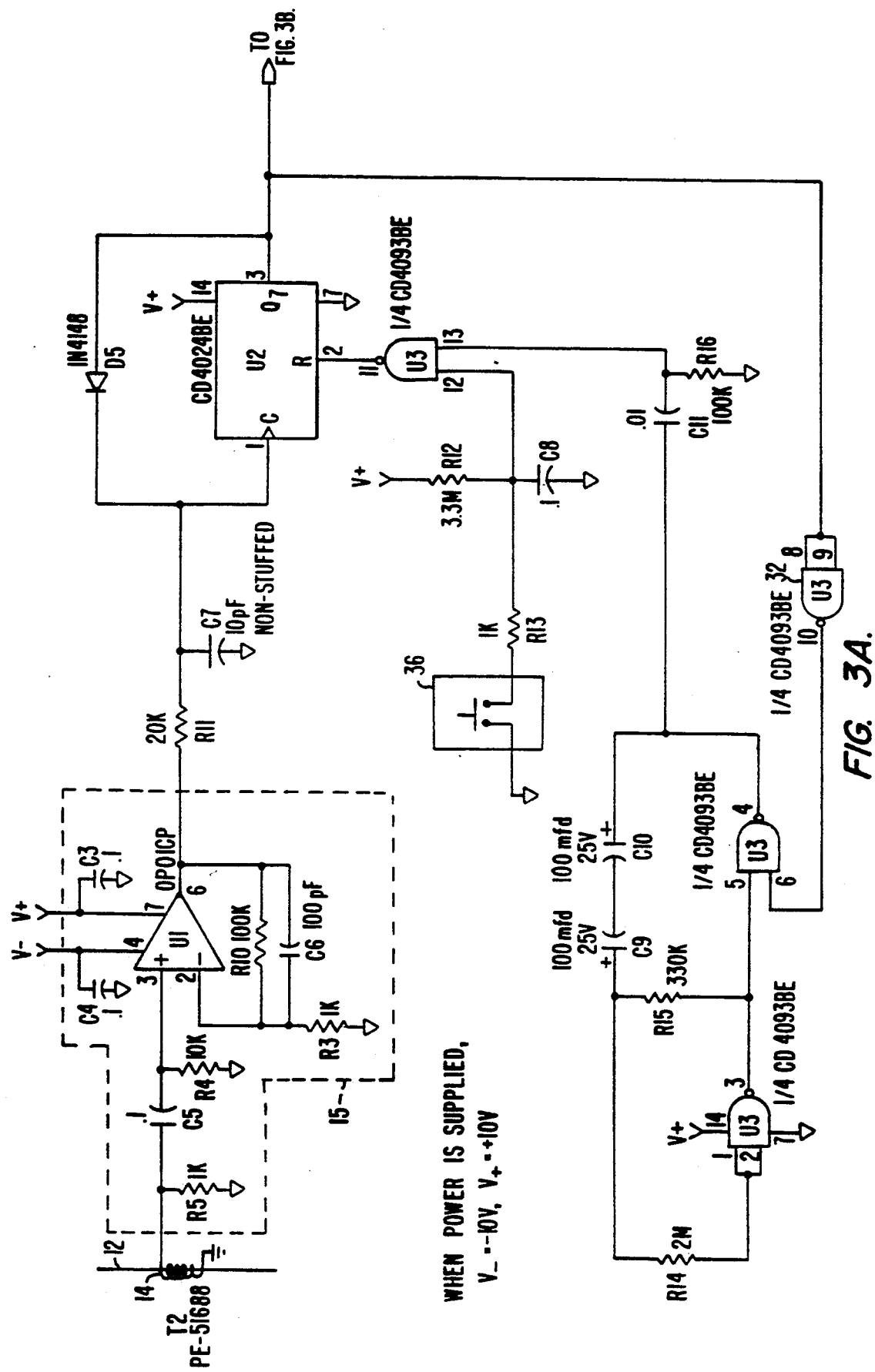

FIGS. 3A and 3B are schematic diagrams showing one detailed circuit which is used in an embodiment of an arc detector according to the present invention.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. An arc detector for detecting electrical arcs across a break in a line carrying a current in an electrical system, the line carrying a current when a path is provided for current flow, the path either provided by the line without a break or by an arc across the break in the line, with no current path being provided when the break is present and no arc is present, the arc detector comprising:
   a current sensor coupled to the line carrying the current, for measuring a current amplitude and providing a current signal proportional to said current amplitude;
   a filtering amplifier for amplifying only desired frequency components of said current signal into an amplified signal and for rejecting unwanted low frequency components, wherein arc pulses form steep clock edges in said amplified signal; and
   an accumulator, coupled to an output of said filtering amplifier and having a reset input, for counting said steep clock edges in said amplified signal, said accumulator asserting a detection signal at an output node when said accumulator accumulates a predetermined threshold number of clock edges, said accumulator beginning an accumulation of clock edges after a reset signal is asserted at said reset input to said accumulator.

2. An arc detector for detecting electrical arcs across a break in a line carrying a current in an electrical system, the line carrying a current when a path is provided for current flow, the path either provided by the line without a break or by an arc across the break in the line, with no current path being provided when the break is present and no arc is present, the arc detector comprising:
   a current transformer coupled to the line carrying the current, for measuring a current amplitude and providing a current signal proportional to said current amplitude;
   a filtering amplifier for amplifying only desired frequency components of said current signal into an amplified signal and for rejecting unwanted low frequency components, wherein arc pulses form steep clock edges in said amplified signal; and
   an accumulator, coupled to an output of said filtering amplifier and having a reset input, for counting said steep clock edges in said amplified signal, said accumulator asserting a detection signal at an output node when said accumulator accumulates a predetermined threshold number of clock edges, said accumulator beginning an accumulation of clock edges after a reset signal is asserted at said reset input to said accumulator.

3. The arc detection circuit of claim 2, further comprising a disabling means, coupled to said output node, for disabling a flow of current through the line carrying current in the electrical system in response to the assertion of the detection signal at said output node by said accumulator.

4. An arc detector for detecting electrical arcs across a break in a line carrying a current in an electrical system, the line carrying a current when a path is provided for current flow, the path either provided by the line without a break or by an arc across the break in the line, with no current path being provided when the break is present and no arc is present, the arc detector comprising:
   a current sensor coupled to the line carrying the current, for measuring a current amplitude and providing a current signal proportional to said current amplitude;
   a filter for filtering out unwanted frequency components from said current signal;
   an amplifier for amplifying said current signal into an amplified signal by a factor sufficient that desired frequency components which were not filtered out of said current signal by said filter form steep clock edges in said amplified signal;
   a counter, coupled at a clock input to said amplifier and having a reset input, for counting said steep clock edges in said amplified signal, said counter asserting a detection signal at an output node when said counter counts up to a predetermined threshold number, said counter beginning a count to said predetermined threshold number after a reset signal is asserted at said reset input;
   a reset circuit coupled to said reset input for resetting said counter in response to any one of a set of predetermined reset conditions; and
   a latching circuit coupled to said output node and said counter for disabling said clock input when said detection signal is asserted.

5. The arc detection circuit of claim 4, wherein said desired frequency components are in a range from about 1 kilohertz to about 10 kilohertz.

6. The arc detection circuit of claim 4, further comprising a solid state relay coupled in series with the line carrying current in the electrical system, said solid state relay also coupled to said output node, wherein said solid state relay causes an open circuit in the line carrying current when said detection signal is asserted and wherein said solid state relay causes a closed circuit in the line carrying current when said detection signal is not asserted.

7. The arc detection circuit of claim 4, wherein said current sensor is a current transformer coiled around the line carrying current.

8. The arc detection circuit of claim 4, wherein the arc detection circuit is employed in a power supply, wherein said power supply provides a flow of power to the electrical system, and wherein an assertion of detection signal causes said power supply to stop said flow of power to the electrical system.

9. The arc detection circuit of claim 4, wherein the arc detection circuit is coupled to a power line, wherein said power line socket provides a flow of power to the electrical system, and wherein an assertion of said detection signal indicates the presence of arcs in the electrical system and said assertion of said detection signal causes said flow of power to the electrical system to stop.

10. The arc detection circuit of claim 4, wherein the arc detection circuit is coupled to a power line socket, wherein said power line socket provides a flow of power through said power line socket, and wherein an assertion of said detection signal detects arcs in an electrical system connected to said power line socket and said assertion of said detection signal causes said relay to be an open circuit, thereby stopping said flow of power to said power line socket, said relay also forming part of a ground-fault interruption detection circuit.

11. The arc detection circuit of claim 4, wherein said set of predetermined reset conditions comprises a manual reset condition which exists when a reset switch is pressed, a power on condition which exists for a predetermined reset period after power is supplied to the arc detection circuit, and a time out condition which exists when a predetermined counting period passes without said counter counting up to said predetermined threshold number.

12. The arc detection circuit of claim 11 further comprising a second latching circuit for disabling a time out signal, wherein said time out signal is asserted when said time out condition exists, said second latching circuit disabling said time out signal in response to the assertion of said detection signal.

13. The arc detection circuit of claim 11, wherein said power up reset condition is determined by a capacitor and resistor in series, said capacitor and said resistor together characterized by a time constant, and wherein said predetermined reset period is determined by said time constant.

* * * * *